United States Patent
Kumagai et al.

(10) Patent No.: US 7,144,491 B2
(45) Date of Patent: Dec. 5, 2006

(54) COPPER ELECTROLYTIC SOLUTION CONTAINING ORGANIC SULFUR COMPOUND AND QUATERNARY AMINE COMPOUND OF SPECIFIED SKELETON AS ADDITIVES AND ELECTROLYTIC COPPER FOIL PRODUCED THEREWITH

(75) Inventors: Masashi Kumagai, Hitachi (JP); Mikio Hanafusa, Hitachi (JP)

(73) Assignee: Nikko Materials Co., Ltd., Tokyo (JP)

(*) Notice: Subject to any disclaimer, the term of this patent is extended or adjusted under 35 U.S.C. 154(b) by 219 days.

(21) Appl. No.: 10/480,710

(22) PCT Filed: Aug. 20, 2003

(86) PCT No.: PCT/JP03/10552

§ 371 (c)(1),
(2), (4) Date: Dec. 11, 2003

(87) PCT Pub. No.: WO2004/035874

PCT Pub. Date: Apr. 29, 2004

(65) Prior Publication Data

US 2005/0173256 A1    Aug. 11, 2005

(30) Foreign Application Priority Data

Oct. 21, 2002  (JP)  .............................. 2002-305650

(51) Int. Cl.
C25D 3/38 (2006.01)
C23C 18/00 (2006.01)
(52) U.S. Cl. ..................................... 205/296; 106/1.26
(58) Field of Classification Search ................ 205/296; 106/1.26

See application file for complete search history.

(56) References Cited

U.S. PATENT DOCUMENTS 3,636,114 A * 1/1972 Tobler et al. ................ 564/292
4,384,930 A 5/1983 Eckles ....................... 204/43 S
4,490,220 A 12/1984 Houman .................... 204/52 R
6,800,188 B1 * 10/2004 Hagiwara et al. ........... 205/296

FOREIGN PATENT DOCUMENTS

| EP | 1 069 211 | 1/2001 |
| EP | 1 219 729 | 7/2002 |
| EP | 1 264 918 | 12/2002 |
| JP | 08-053789 | 2/1996 |
| JP | 2002-508452 | 3/2002 |
| WO | WO 99/31300 | 6/1999 |

* cited by examiner

Primary Examiner—Edna Wong
(74) Attorney, Agent, or Firm—Flynn, Thiel, Boutell & Tanis, P.C.

(57) ABSTRACT

It is an object of the present invention to obtain a low-profile electrolytic copper foil with a small surface roughness on the side of the rough surface (the opposite side from the lustrous surface) in the manufacture of an electrolytic copper foil using a cathode drum, and more particularly to obtain an electrolytic copper foil which allows fine patterning, and which is superior in terms of elongation and tensile strength at ordinary temperatures and high temperatures. Furthermore, it is an object of the present invention to obtain a copper electrolytic solution for this purpose. This copper electrolytic solution contains as additives an organo-sulfur compound and a quaternary amine compound with a specific skeleton.

2 Claims, 4 Drawing Sheets

COPPER ELECTROLYTIC SOLUTION CONTAINING ORGANIC SULFUR COMPOUND AND QUATERNARY AMINE COMPOUND OF SPECIFIED SKELETON AS ADDITIVES AND ELECTROLYTIC COPPER FOIL PRODUCED THEREWITH

TECHNICAL FIELD

The present invention relates to a copper electrolytic solution used in the manufacture of an electrolytic copper foil, and more particularly to a copper electrolytic solution which is used in the manufacture of an electrolytic copper foil that allows fine patterning and that is superior in terms of elongation and tensile strength at ordinary temperatures and high temperatures.

BACKGROUND ART

Generally, a rotating metal cathode drum with a polished surface, and an insoluble metal anode which is disposed on more or less the lower half of this cathode drum and surrounds the circumference of the cathode drum, are used to manufacture electrolytic copper foils. A copper electrolytic solution is caused to flow between the above-mentioned drum and anode, and an electrical potential is applied across these parts, so that copper is electrodeposited on the cathode drum. Then, when the electrodeposited copper has reached a specified thickness, this deposited copper is peeled from the cathode drum, so that a copper foil is continuously manufactured.

The copper foil thus obtained is generally referred to as a raw foil; this foil is subsequently subject to several surface treatments, and is used in printed wiring boards or the like.

An outline of a conventional copper foil manufacturing apparatus is shown in FIG. 4. In this electrolytic copper foil manufacturing apparatus, a cathode drum 1 is disposed in an electrolytic bath at which accommodates an electrolytic solution. This cathode drum 1 rotates in a state in which the drum is partially immersed (i.e., more or less the lower half of the drum is immersed) in the electrolytic solution.

An insoluble anode 2 is disposed so that this anode surrounds the lower half of the circumference of the cathode drum 1. There is a fixed gap 3 between this cathode drum 1 and anode 2, and an electrolytic solution flows through this gap. Two anode plates are disposed in the apparatus shown in FIG. 4.

In this apparatus shown in FIG. 4, the electrolytic solution is supplied from below; the apparatus is constructed so that this electrolytic solution passes through the gap 3 between the cathode drum 1 and anode 2 and overflows from the upper rim of the anode 2, and so that this electrolytic solution is recirculated. A specified voltage can be maintained between the cathode drum 1 and anode 2 by interposing a rectifier between these members.

As the cathode drum 1 rotates, the thickness of the copper electrodeposited from the electrolytic solution increases, and when this thickness exceeds a certain thickness, the raw foil 4 is peeled away and continuously taken up. The thickness of the raw foil that is thus manufactured can be adjusted by adjusting the distance between the cathode drum 1 and the anode 2, the flow velocity of the electrolytic solution that is supplied, or the amount of electricity that is supplied.

In the copper foil that is manufactured by such an electrolytic copper foil manufacturing apparatus, the surface that contacts the cathode drum is a mirror surface; however, the surface on the opposite side is a rough surface with projections and indentations. In the case of ordinary electrolysis, the projections and indentations of this rough surface are severe, so that undercutting tends to occur during etching, and the achievement of a fine pattern is difficult.

Recently, meanwhile, as the density of printed wiring boards has increased, the narrowing of circuit width and the development of multi-layer circuits have led to a demand for copper foils that allow fine patterning. In order to achieve such fine patterning, a copper foil that is superior in terms of etching characteristics is required.

Furthermore, in regard to the performance values required in copper foils used in printed wiring boards, not only elongation at ordinary temperatures, but also high-temperature elongation characteristics for the purpose of preventing cracking caused by thermal stress, and a high tensile strength for dimensional stability of the printed wiring board, are required. However, copper foils of the above-mentioned type in which the projections and indentations of the rough surface are severe are completely unsuitable for fine patterning, as was described above. For such reasons, smoothing of the rough surface to a low profile has been investigated.

It is generally known that such a low profile can be achieved by adding large amounts of glue or thiourea to the electrolytic solution.

However, such additives lead to the problem of an abrupt drop in the elongation at ordinary temperatures and high temperatures, thus causing a great drop in the performance as a copper foil for use in printed wiring boards.

DISCLOSURE OF THE INVENTION

It is an object of the present invention to obtain a low-profile electrolytic copper foil with a small surface roughness on the side of the rough surface (the opposite side from the lustrous surface) in the manufacture of an electrolytic copper foil using a cathode drum, and more particularly to obtain an electrolytic copper foil which allows fine patterning, and which is superior in terms of elongation and tensile strength at ordinary temperatures and high temperatures.

The present inventors discovered that an electrolytic copper foil which allows fine patterning, and which is superior in terms of elongation and tensile strength at ordinary temperatures and high temperatures, can be obtained by adding an optimal amount of an additive, which makes it possible to achieve a low profile to the electrolytic solution.

On the basis of this finding, the present inventors discovered that an electrolytic copper foil which allows fine patterning and which is superior in terms of elongation and tensile strength at ordinary temperatures and high temperatures can be obtained by performing electrolysis using a copper electrolytic solution containing a quaternary amine compound with a specific skeleton and an organo-sulfur compound in an electrolytic copper foil manufacturing method in which a copper foil is continuously manufactured by causing a copper electrolytic solution to flow between a cathode drum and an anode so that copper is electrodeposited on the cathode drum, and peeling the electrodeposited copper foil from the cathode drum. This discovery led to the present invention.

Specifically, the present invention comprises the following constructions:

[1] A copper electrolytic solution which contains as additives an organo-sulfur compound and a quaternary amine compound with a specific skeleton expressed by the following general formula (1) which is obtained by an addition reaction between a compound which has one or more epoxy groups per molecule and an amine compound, followed by a quaternization of the nitrogen.

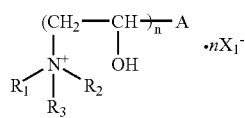
(1)

(In general formula (1), $R_1$ and $R_2$ each separately is a group selected from the group consisting of a hydroxyalkyl group, an ether group, an aromatic group, an aromatic-substituted alkyl group, an unsaturated hydrocarbon group and an alkyl group, $R_3$ is a benzyl group, an allyl group or an alkyl group, A is an epoxy compound residue, $X_1^-$ is $Cl^-$, $Br^-$ or $CH_3SO_4^-$, and n is an integer of 1 or greater.)

[2] The copper electrolytic solution according to the above [1], in which the epoxy compound residue A of the quaternary amine compound with a specific skeleton has a linear ether linkage.

[3] The copper electrolytic solution according to the above [1] or [2], in which the quaternary amine compound with a specific skeleton is one of the compounds expressed by the following general formulae (2) through (9).

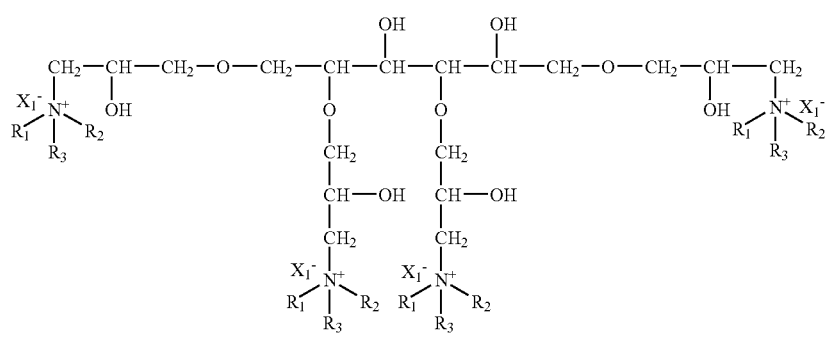
(2)

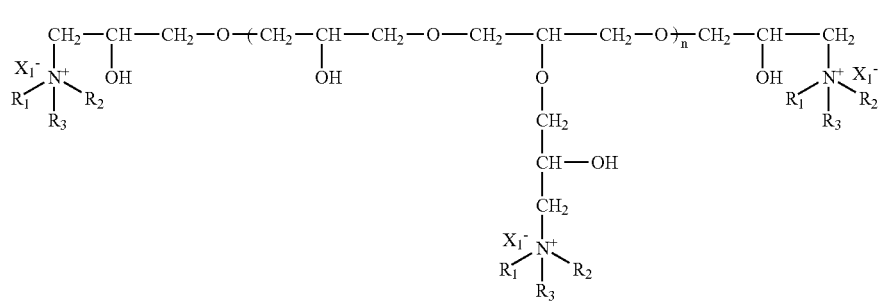
(3)

(n: an integer of 1 to 5)

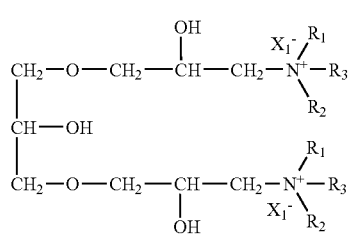
(4)

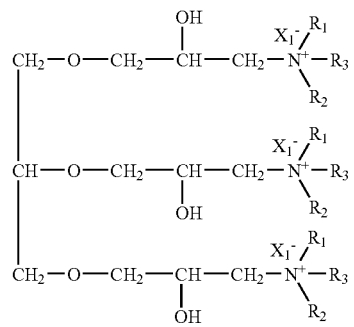
(5)

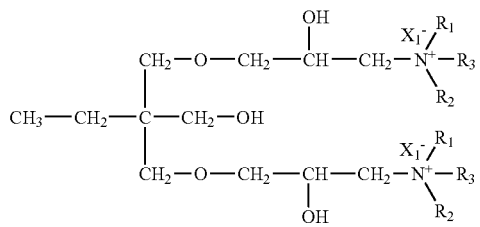 (6)

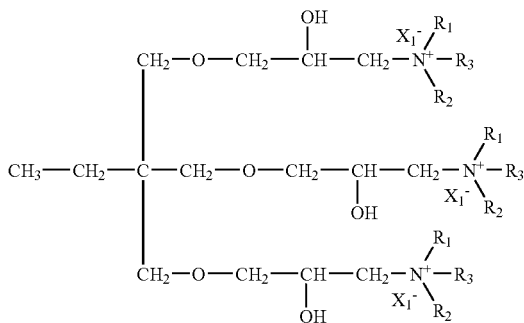 (7)

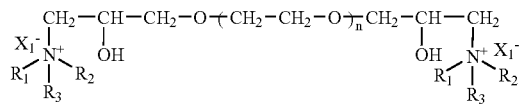 (8)

(n: an integer of 1 to 22)

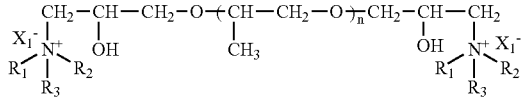 (9)

(n: an integer of 1 to 3)

(In general formulae (2) through (9), $R_1$ and $R_2$ each indicate a group selected from the group consisting of a hydroxyalkyl group, an ether group, an aromatic group, an aromatic-substituted alkyl group, an unsaturated hydrocarbon group and an alkyl group, $R_3$ indicates a benzyl group, an allyl group or an alkyl group with 1 to 5 carbon atoms, and $X_1^-$ indicates $Cl^-$, $Br^-$ or $CH_3SO_4^-$.)

[4] The copper electrolytic solution according to the above [1] 1, in which the organo-sulfur compound is a compound expressed by general formula (10) or (11).

$$R^4—S—R^3—SO_3Z \quad (11)$$

(In general formulae (10) and (11), $R^1$, $R^2$ and $R^3$ each indicate an alkylene group with 1 to 8 carbon atoms, $R^4$ indicates a group selected from the group consisting of hydrogen,

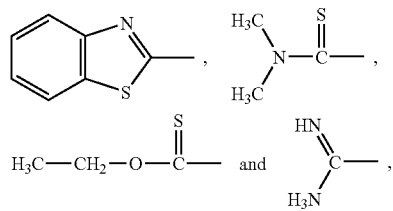

X indicates a group selected from the group consisting of a sulfonic acid group, a phosphonic acid group, and a sulfonic acid- or phosphonic acid-alkali metal salt group or ammonium salt group, Y indicates a group selected from the group consisting of a sulfonic acid group, a phosphonic acid group, and a sulfonic acid- or phosphonic acid-sodium or potassium salt group, Z indicates hydrogen, sodium or potassium, and $n_4$ is 2 or 3.)

[5] An electrolytic copper foil which is manufactured using the copper electrolytic solution according to any of the above [1] through [4].

[6] A copper-clad laminated board which is formed using the electrolytic copper foil according to the above [5].

In the present invention, it is important that the electrolytic solution contain an organo-sulfur compound and a quaternary amine compound with a specific skeleton expressed by the above-defined general formula (1) which is obtained by an addition reaction between a compound that has one or more epoxy groups per molecule and an amine compound, followed by a quaternization of the nitrogen. If only one of these compounds is added, the object of the present invention cannot be achieved.

The quaternary amine compound (1) with a specific skeleton is obtained by synthesizing an amine compound with this specific skeleton by an addition reaction expressed by the reaction formula shown below, followed by a quaternization of the nitrogen. Specifically, this compound can be manufactured by synthesizing an amine compound with a specific skeleton by mixing a compound that has one or more epoxy groups per molecule and an amine compound and reacting these compounds for approximately 30 minutes to 6 hours at 50 to 150° C., and then quaternizing the nitrogen by adding a quaternizing agent and performing a reaction for approximately 30 minutes to 6 hours at 50 to 150° C.

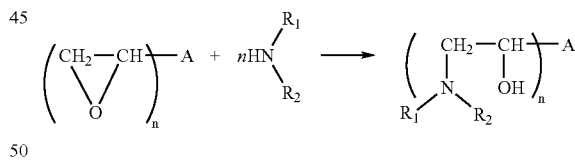

(In the above formula, $R_1$ and $R_2$ each separately is a group selected from the group consisting of a hydroxyalkyl group, an ether group, an aromatic group, an aromatic-substituted alkyl group, an unsaturated hydrocarbon group and an alkyl group, A is an epoxy compound residue, and n is an integer of 1 or greater.)

Concrete examples of $R_1$ and $R_2$ in the structure of the amine compound with a specific skeleton include hydroxyethyl group, hydroxyisopropyl group (both hydroxyalkyl groups), 2-ethoxyethyl group, 2-propoxyethyl group (both ether groups), phenyl group, naphthyl group (both aromatic groups), tolyl group, xylyl group, cumenyl group, 1-phenylethyl group (all aromatic-substituted alkyl groups), allyl group, 1-propenyl group, isopropenyl group, 1-butenyl group, 2-butenyl group, 2-methylallyl group (all unsaturated hydrocarbon groups), methyl group, ethyl group, propyl group, butyl group, pentyl group, hexyl group, heptyl group and octyl group (all alkyl groups). From the standpoint of water solubility, substituent groups with an excessively large number of carbon atoms are undesirable; it is desirable that the number of carbon atoms per substituent group be 8 or less.

Examples of quaternizing agents that can be used to quaternize the nitrogen include alkyl halides, benzyl chloride, dimethylsulfuric acid, allyl bromide and the like. $R_3$ and $X_1^-$ in general formula (1) are determined by this quaternizing agent.

Alkyl groups with 1 to 8 carbon atoms are desirable as the alkyl group in $R_3$. Alkyl groups with 1 to 5 carbon atoms are even more desirable.

Compounds which have a linear ether linkage in the epoxy compound residue A are desirable as the above-mentioned quaternary amine compound with a specific skeleton; compounds expressed by the following general formulae (2) through (9) are desirable as the above-mentioned quaternary amine compound in which the epoxy compound residue A has a linear ether linkage. These compounds can be obtained by using polyglycidyl ethers of polyhydric alcohols, for example, sorbitol polyglycidyl ethers, polyglycerol polyglycidyl ethers, glycerol polyglycidyl ethers, trimethylolpropane polyglycidyl ethers, ethylene glycol diglycidyl ethers, polyethylene glycol diglycidyl ethers, propylene glycol diglycidyl ethers, polypropylene glycol diglycidyl ethers or the like as raw-material compounds which have one or more epoxy groups per molecule. Furthermore, compounds expressed by the following general formulae (2) through (9) need not be used singly, but may also be used "as is" in mixtures in cases where the manufactured product is obtained as a mixture, as indicated for example by the compounds expressed by the general formulae (6) and (7). The epoxy compound residues A in general formulae (2) through (9) are as shown below.

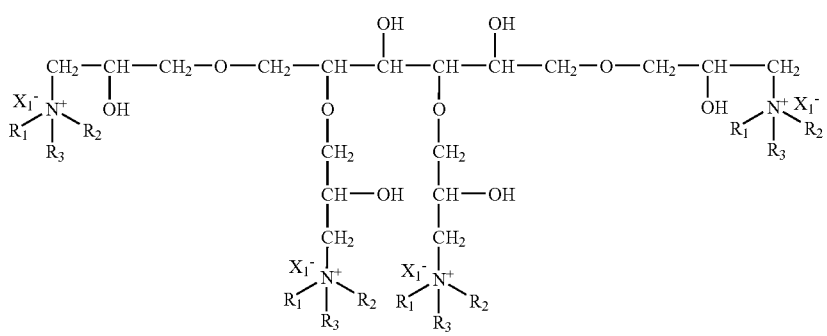

(2)

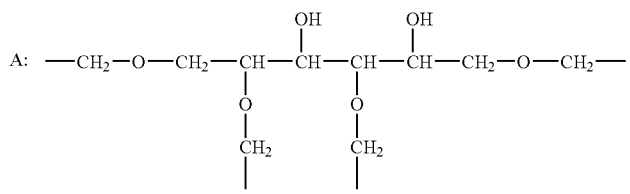

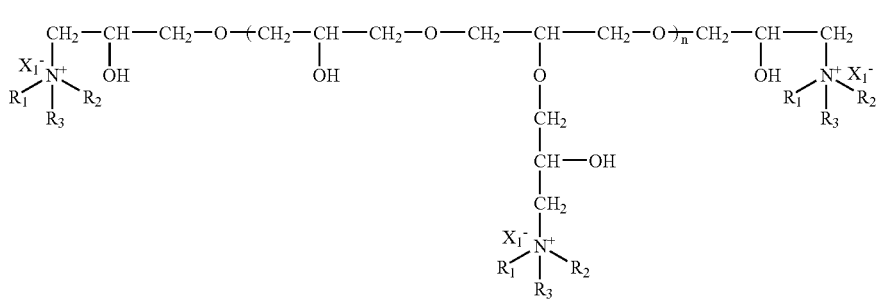

(3)

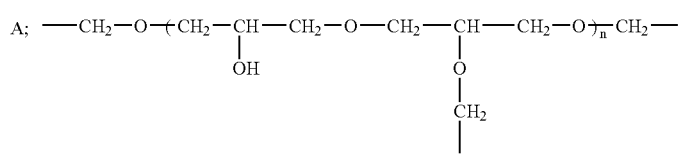

(n: an integer of 1 to 5)

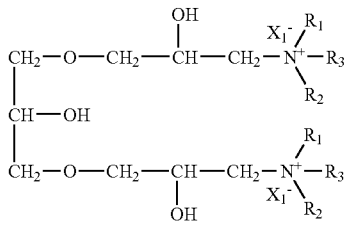
(4)

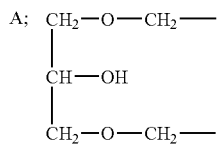

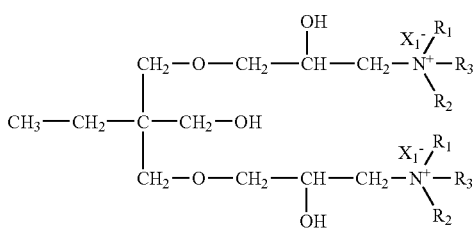
(6)

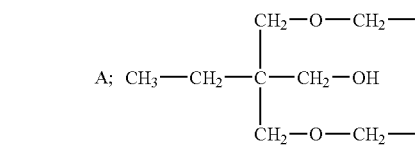

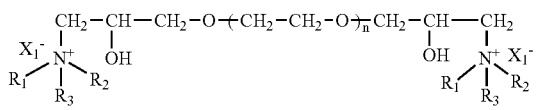
(8)

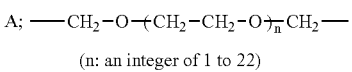
(n: an integer of 1 to 22)

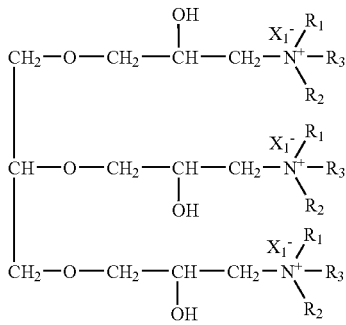
(5)

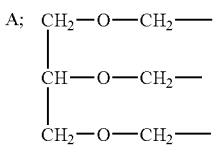

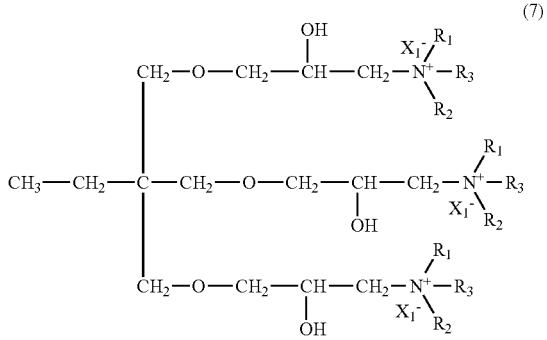
(7)

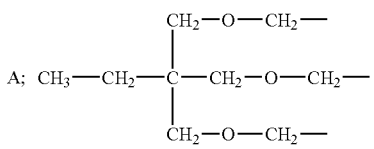

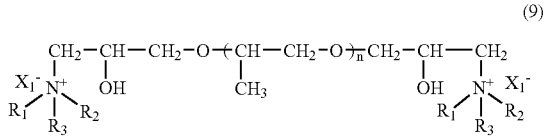
(9)

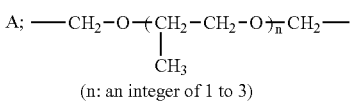
(n: an integer of 1 to 3)

(In general formulae (2) through (9), $R_1$ and $R_2$ each separately is a group selected from the group consisting of a hydroxyalkyl group, an ether group, an aromatic group, an aromatic-substituted alkyl group, an unsaturated hydrocarbon group and an alkyl group, $R_3$ indicates a benzyl group, an allyl group or an alkyl group with 1 to 5 carbon atoms, A is an epoxy compound residue, and $X_1^-$ is $Cl^-$, $Br^-$ or $CH_3SO_4^-$.)

Furthermore, It is desirable that the organo-sulfur compound be a compound which has a structural formula expressed by the above general formula (10) or (11).

The following compounds may be cited, and are desirable for use, as organo-sulfur compounds expressed by the above general formula (10).

$H_2O_3P—(CH_2)_3—S—S—(CH_1)_3—PO_3H_2$ $HO_3S—(CH_2)_4—S—S—(CH_2)_4—SO_3H$ $NaO_3S—(CH_2)_3—S—S—(CH_2)_3—SO_3Na$ $HO_3S—(CH_2)_2—S—S—(CH_2)_2—SO_3H$ $CH_3—S—S—CH_2—SO_3H$

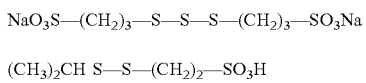

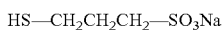

Furthermore, the following compounds may be cited, and are desirable for use, as compounds expressed by the above general formula (11).

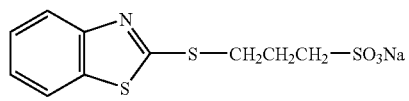

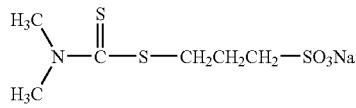

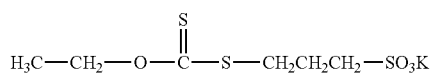

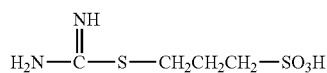

The ratio of the quaternary amine compound and the organo-sulfur compound in the electrolytic solution is in the range of 1:5 to 5:1 in terms of weight ratio, and is preferably in the range of 1:2 to 2:1. It is desirable that the concentration of the quaternary amine compound in the copper electrolytic solution be 1 to 50 ppm.

Besides the above-mentioned organo-sulfur compound and quaternary amine compound with a specific skeleton, universally known additives, e. g., polyether compounds such as polyethylene glycol, polypropylene glycol and the like, and other compounds such as polyethyleneimine, phenazine dyes, glue, cellulose and the like, may be added to the copper electrolytic solution.

Furthermore, the copper-clad laminated board obtained by laminating the electrolytic copper foil of the present invention is a copper-clad laminated board which is superior in terms of elongation and tensile strength at ordinary temperatures and high temperatures.

EXPLANATION OF SYMBOLS

1 Cathode drum
2 Anode
3 Gap
4 Raw foil

BEST MODE FOR CARRYING OUT THE INVENTION

The present invention will be described in detail in terms of examples below.

Example of Synthesis of Quaternary Amine Compound with Specific Skeleton 10.0 g of an epoxy compound expressed by the chemical formula shown below (Denacol EX-521 manufactured by Nagase Kasei Kogyo K.K.) (epoxy groups: 0.0544 mol) and 61.2 g of a 40% aqueous solution of dimethylamine (0.544 mol) were placed in a three-necked flask, and a reaction was performed for 3 hours at 60° C. using a condenser tube with dry ice—methanol as a cooling medium. Subsequently, the condenser tube was removed, and nitrogen gas was blown in and the excess dimethylamine was removed. Afterward, 6.88 g (0.0544 mol) of benzyl chloride was added, and quaternization was accomplished by performing a reaction for 3 hours at 100° C.

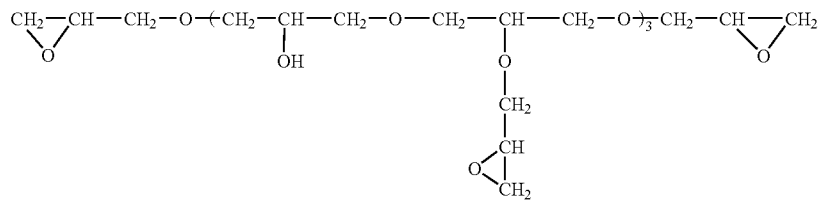

Figure 1:
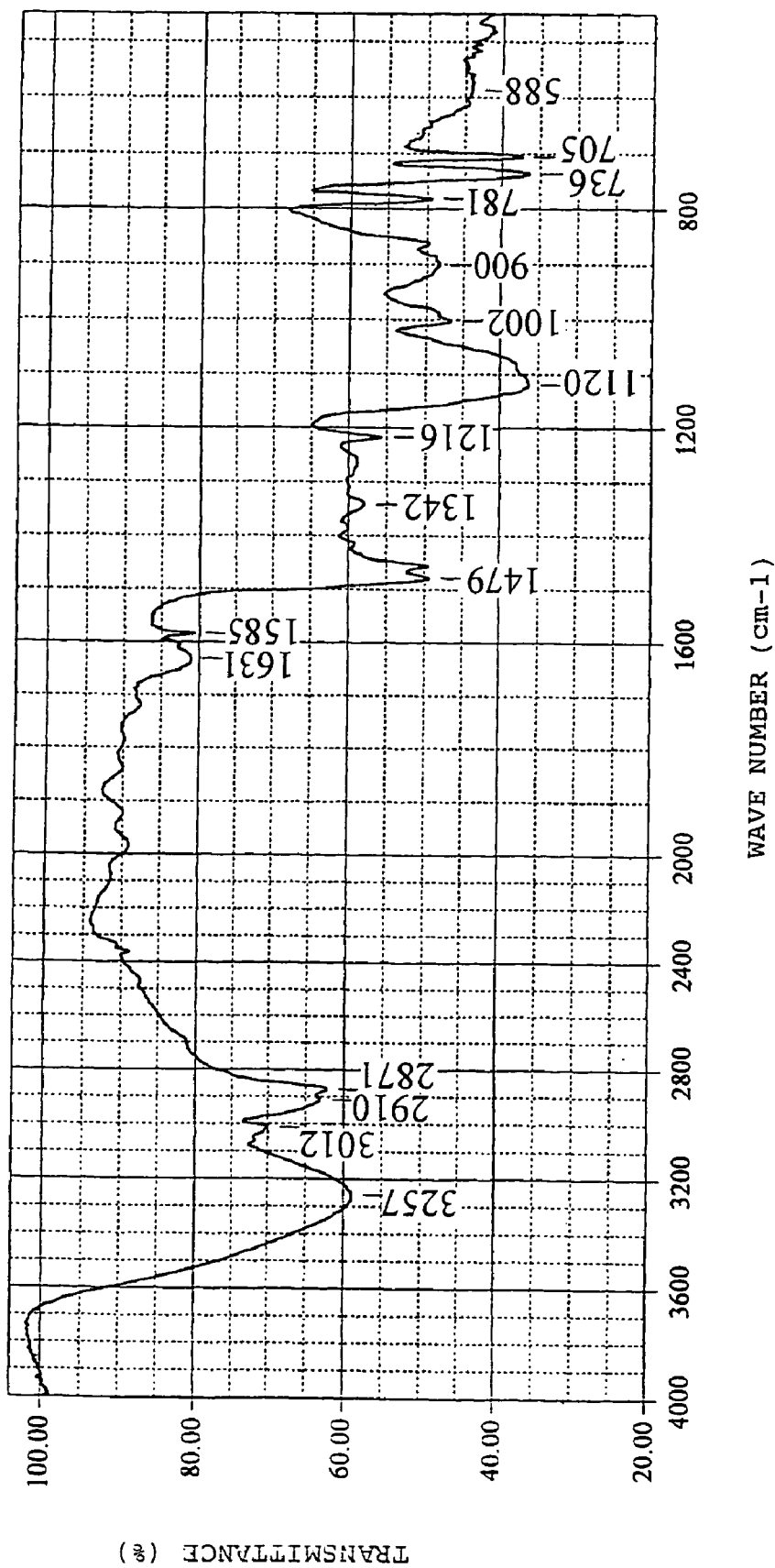
FIG. 1 shows the FT-IR spectrum of a compound obtained as an example of synthesis of a quaternary amine compound which has a specified structure.
Figure 2:
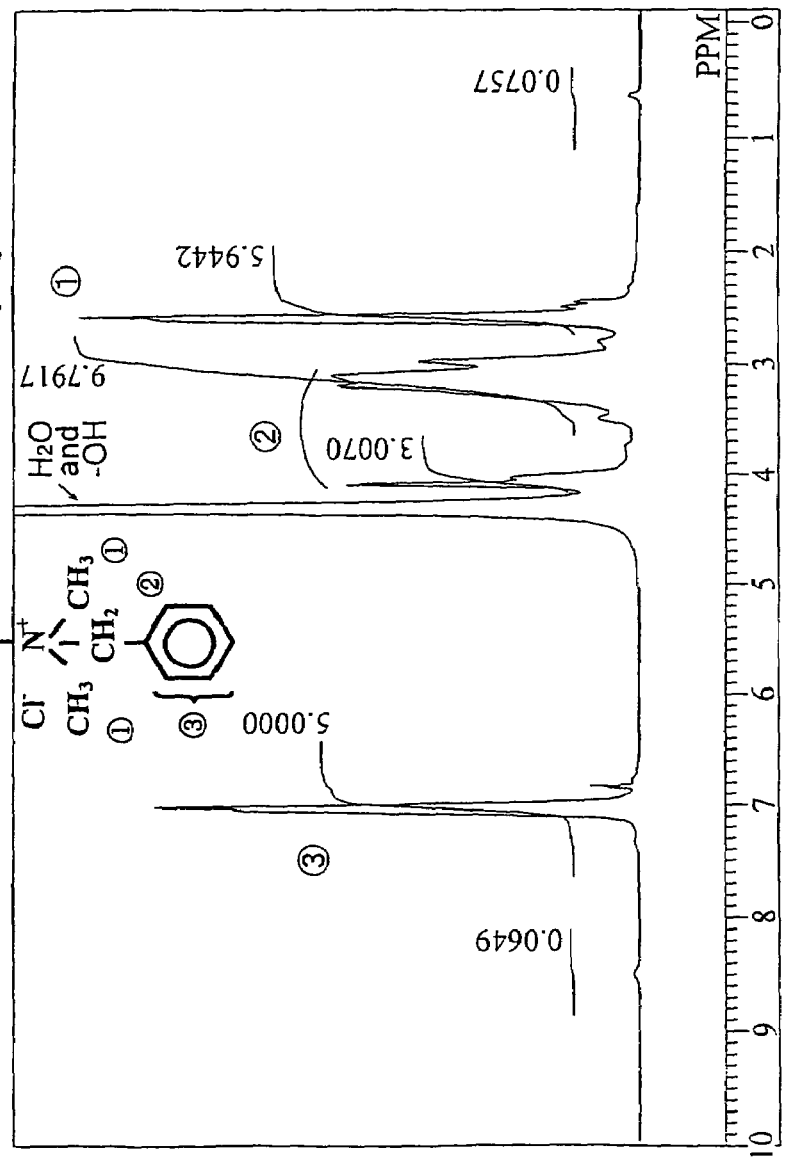
FIG. 2 shows the $^1$H-NMR spectrum of a compound obtained as an example of synthesis of a quaternary amine compound which has a specified structure.
Figure 3:
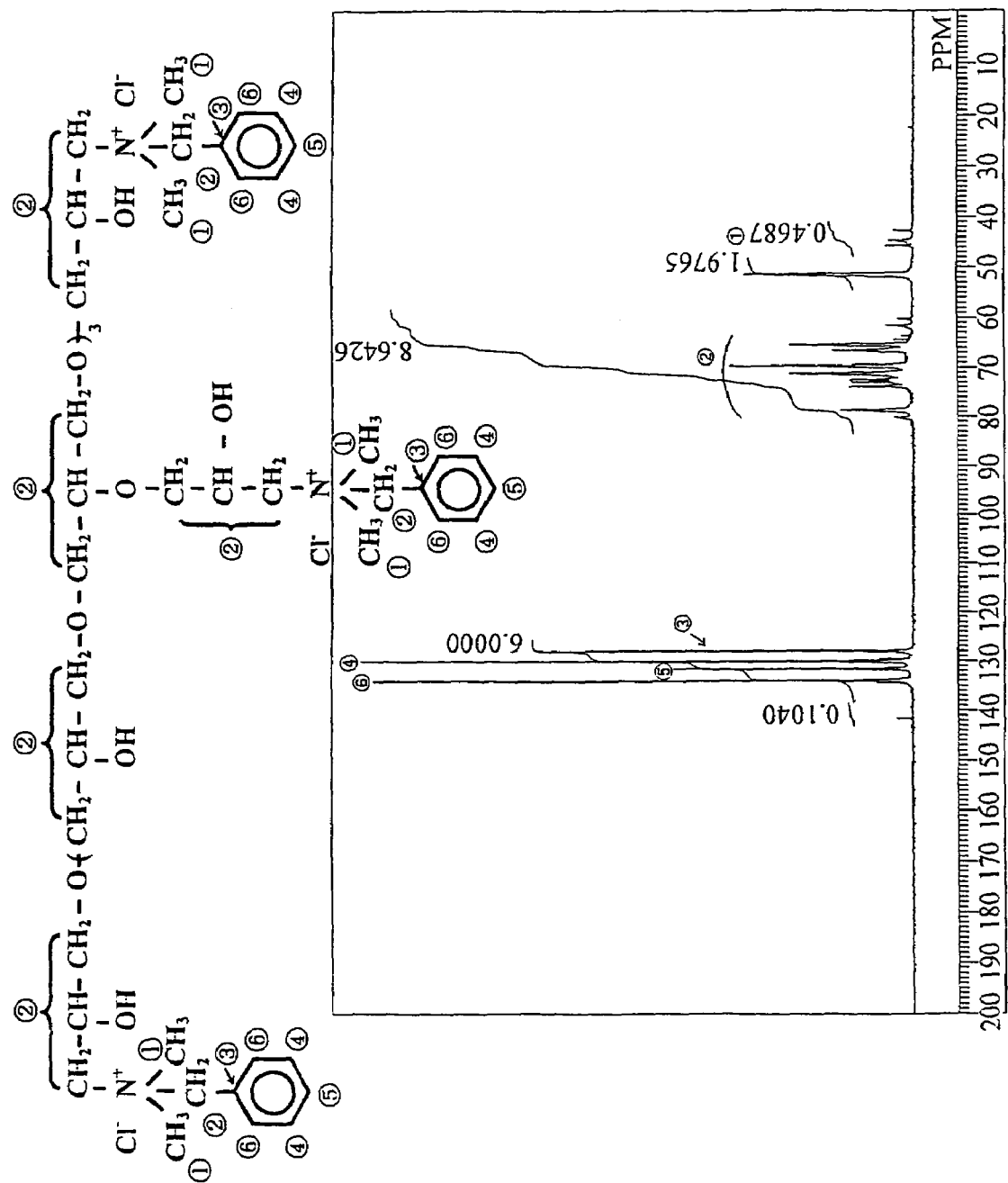
FIG. 3 shows the $^{13}$C-NMR spectrum of a compound obtained as an example of synthesis of a quaternary amine compound which has a specified structure.
Figure 4:
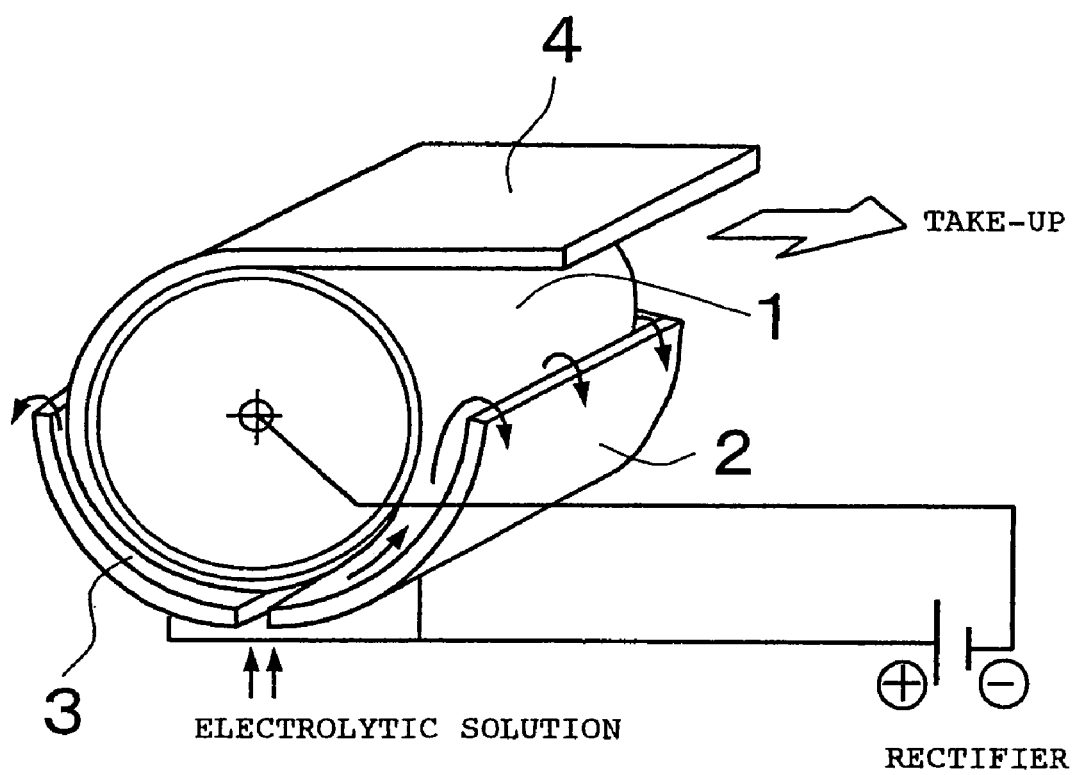
FIG. 4 is a diagram which shows one example of an electrolytic copper foil manufacturing apparatus.

The compound that was produced by the reaction was identified by FT-IR, $^1$H-NMR and $^{13}$C-NMR. The FT-IR, $^1$H-NMR and $^{13}$C-NMR spectra of the compound thus obtained are shown in FIGS. 1 through 3. The compound produced was a quaternary amine compound expressed by the following chemical formula.

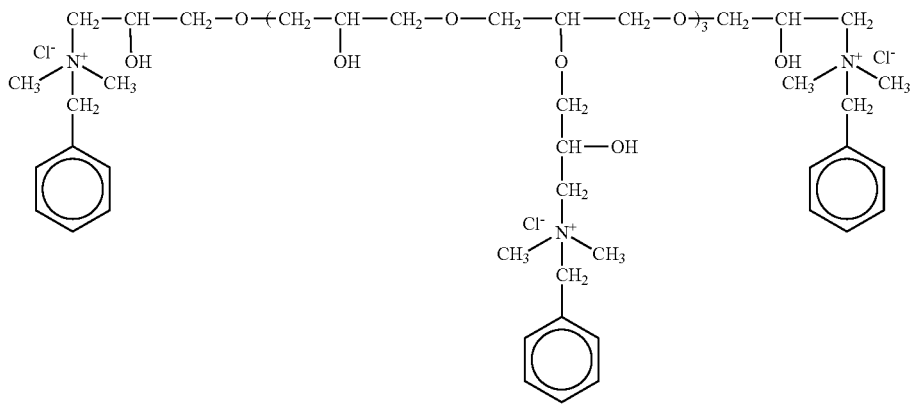

Next, quaternary amine compounds were produced in the same manner as in the manufacture of the above-mentioned quaternary amines, except that the dimethylamine used in the synthesis of the amine compound was changed to dibenzylamine, bis(2-ethoxyethyl)amine, diethanolamine, diphenylamine or diallylamine.

Examples 1 to 12 and Comparative Examples 1 to 9

An electrolytic copper foil with a thickness of 35 μm was manufactured using the electrolytic copper foil manufacturing apparatus shown in FIG. 1. The composition of the electrolytic solution was as shown below, and the amounts of additives added were as shown in Table 1.
Cu: 90 g/L
$H_2SO_4$: 80 g/L
Cl: 60 ppm
Temperature: 55 to 57° C.
Additive A: Bis(3-sulfopropyl)disulfide disodium salt (SPS manufactured by Raschig Co.)
Additive B: 3-Mercapto-1-propane sulfonic acid sodium salt (MPS manufactured by Raschig Co.)
Additive C: Quaternary amine compound with the specified structure obtained in the above-mentioned synthesis example
C1: Benzyl chloride modified product of dibenzylamine
C2: Benzyl chloride modified product of bis(2-ethoxyethyl)amine
C3: Benzyl chloride modified product of diethanolamine
C4: Benzyl chloride modified product of diphenylamine
C5: Benzyl chloride modified product of diallylamine
C6: Benzyl chloride modified product of dimethylamine The surface roughness Rz (μm) of each of the electrolytic copper foils obtained was measured for the side of the rough surface, i.e., the opposite side from the lustrous surface, according to JIS B 0601, and the ordinary-temperature elongation (%), ordinary-temperature tensile strength (kgf/$mm^2$), high-temperature elongation (%) and high-temperature tensile strength (kgf/$mm^2$) were measured according to IPC-TM650. The results are shown in Table 1.

TABLE 1

| | Additive A (ppm) | Additive B (ppm) | Additive C (ppm) | | | | | | Rz (μm) | Ordinary-temperature elongation (%) | Ordinary-temperature tensile strength (kgf/$mm^2$) | High-temperature elongation (%) | High-temperature tensile strength (kgf/$mm^2$) |
|---|---|---|---|---|---|---|---|---|---|---|---|---|---|
| | | | C1 | C2 | C3 | C4 | C5 | C6 | | | | | |
| Example 1 | 50 | 0 | 50 | 0 | 0 | 0 | 0 | 0 | 1.12 | 8.20 | 33.2 | 14.9 | 22.7 |
| Example 2 | 50 | 0 | 0 | 50 | 0 | 0 | 0 | 0 | 1.10 | 6.72 | 31.5 | 17.2 | 22.0 |
| Example 3 | 50 | 0 | 0 | 0 | 50 | 0 | 0 | 0 | 0.95 | 8.80 | 30.5 | 17.9 | 20.0 |
| Example 4 | 50 | 0 | 0 | 0 | 0 | 50 | 0 | 0 | 1.20 | 8.80 | 36.5 | 12.3 | 20.1 |
| Example 5 | 50 | 0 | 0 | 0 | 0 | 0 | 50 | 0 | 1.12 | 7.12 | 33.9 | 11.9 | 21.0 |
| Example 6 | 50 | 0 | 0 | 0 | 0 | 0 | 0 | 50 | 0.99 | 6.82 | 30.5 | 16.5 | 21.5 |
| Example 7 | 0 | 50 | 50 | 0 | 0 | 0 | 0 | 0 | 1.15 | 8.30 | 33.1 | 15.1 | 19.9 |
| Example 8 | 0 | 50 | 0 | 50 | 0 | 0 | 0 | 0 | 1.13 | 6.99 | 30.5 | 16.3 | 23.4 |
| Example 9 | 0 | 50 | 0 | 0 | 50 | 0 | 0 | 0 | 0.98 | 9.20 | 35.0 | 18.2 | 23.1 |
| Example 10 | 0 | 50 | 0 | 0 | 0 | 50 | 0 | 0 | 1.12 | 8.81 | 37.2 | 13.2 | 23.0 |
| Example 11 | 0 | 50 | 0 | 0 | 0 | 0 | 50 | 0 | 1.23 | 7.30 | 36.0 | 12.5 | 21.3 |
| Example 12 | 0 | 50 | 0 | 0 | 0 | 0 | 0 | 50 | 0.94 | 6.90 | 32.1 | 16.9 | 21.0 |
| Comp. Ex. 1 | 0 | 0 | 0 | 0 | 0 | 0 | 0 | 0 | 5.8 | 8.90 | 37.9 | 12.6 | 20.7 |
| Comp. Ex. 2 | 100 | 0 | 0 | 0 | 0 | 0 | 0 | 0 | 5.5 | 0.2 | 10.3 | 1.0 | 15.3 |
| Comp. Ex. 3 | 0 | 100 | 0 | 0 | 0 | 0 | 0 | 0 | 6.1 | 0.2 | 11.2 | 1.2 | 14.9 |
| Comp. Ex. 4 | 0 | 0 | 100 | 0 | 0 | 0 | 0 | 0 | 5.2 | 0.3 | 11.2 | 1.0 | 15.3 |
| Comp. Ex. 5 | 0 | 0 | 0 | 100 | 0 | 0 | 0 | 0 | 5.9 | 0.1 | 11.3 | 1.2 | 16.1 |

TABLE 1-continued

|  | Additive A (ppm) | Additive B (ppm) | Additive C (ppm) | | | | | | Rz (μm) | Ordinary-temperature elongation (%) | Ordinary-temperature tensile strength (kgf/mm$^2$) | High-temperature elongation (%) | High-temperature tensile strength (kgf/mm$^2$) |
|---|---|---|---|---|---|---|---|---|---|---|---|---|---|
|  |  |  | C1 | C2 | C3 | C4 | C5 | C6 |  |  |  |  |  |
| Comp. Ex. 6 | 0 | 0 | 0 | 0 | 100 | 0 | 0 | 0 | 5.2 | 0.2 | 12.4 | 1.5 | 15.1 |
| Comp. Ex. 7 | 0 | 0 | 0 | 0 | 0 | 100 | 0 | 0 | 5.9 | 0.2 | 12.2 | 1.0 | 14.1 |
| Comp. Ex. 8 | 0 | 0 | 0 | 0 | 0 | 0 | 100 | 0 | 5.3 | 0.1 | 12.5 | 1.3 | 16.2 |
| Comp. Ex. 9 | 0 | 0 | 0 | 0 | 0 | 0 | 0 | 100 | 5.7 | 0.1 | 13.2 | 1.0 | 13.3 |

Comp. Ex.: Comparative Example

As is shown in the above Table 1, in Examples 1 through 12, in which the additives of the present invention (organo-sulfur compound and quaternary amine compound with a specified structure) were added, the surface roughness Rz was in the range of 0.94 to 1.23 μm, the ordinary-temperature elongation was 6.72 to 9.20%, the ordinary-temperature tensile strength was 30.5 to 37.2 kgf/mm$^2$, the high-temperature elongation was 11.9 to 18.2%, and the high-temperature tensile strength was 19.9 to 23.4 kgf/mm$^2$. Thus, in spite of the fact that a conspicuously low profile was achieved, the ordinary-temperature elongation, ordinary-temperature tensile strength, high-temperature elongation and high-temperature tensile strength all showed superior characteristics comparable to those of Comparative Example 1, in which no additives were added. On the other hand, in Comparative Example 1 in which no additives were added, and Comparative Examples 2 through 9 in which only one of the additives was added, a low profile could not be achieved. Furthermore, in cases where only one of the additives was added, poor results were also obtained in terms of the ordinary-temperature elongation, ordinary-temperature tensile strength, high-temperature elongation and high-temperature tensile strength.

INDUSTRIAL APPLICABILITY

As was described above, the copper electrolytic solution of the present invention, to which an organo-sulfur compound and a quaternary amine compound which has a specified structure are added, is extremely effective in achieving a low profile in the rough surface of the electrolytic copper foil obtained using this solution. Furthermore, not only the elongation at ordinary temperatures but also the high-temperature elongation characteristics can be effectively maintained, and a high tensile strength can be similarly obtained. The use of the above additives in combination is essential to this invention and the above superior properties cannot be achieved without using them.

The invention claimed is:

1. In a copper electrolytic solution which is used in the manufacture of an electrolytic copper foil, the improvement comprising the copper electrolytic solution containing, as additives, an organo-sulfur compound and a quaternary amine compound with a specific skeleton expressed by the following general formulae (2)–(4), (6), (7) and (9), which is obtained by an addition reaction between a compound which has one or more epoxy groups per molecule and an amine compound, followed by a quaternization of the nitrogen,

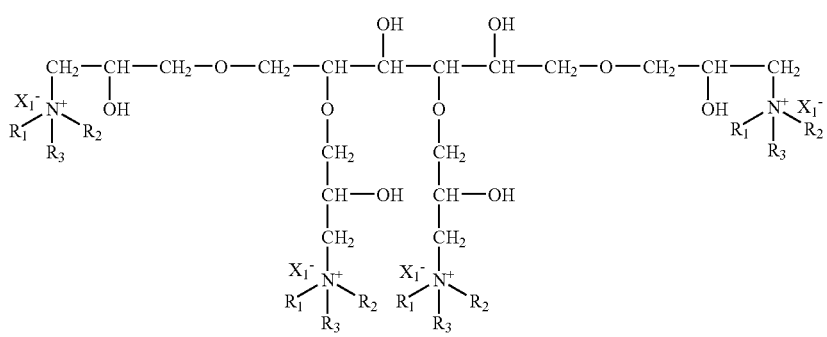

(2)

-continued

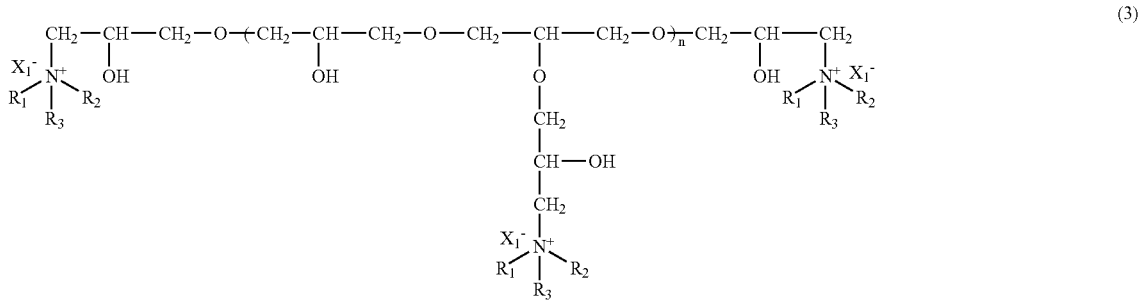
(3)

(n: an integer of 1 to 5)

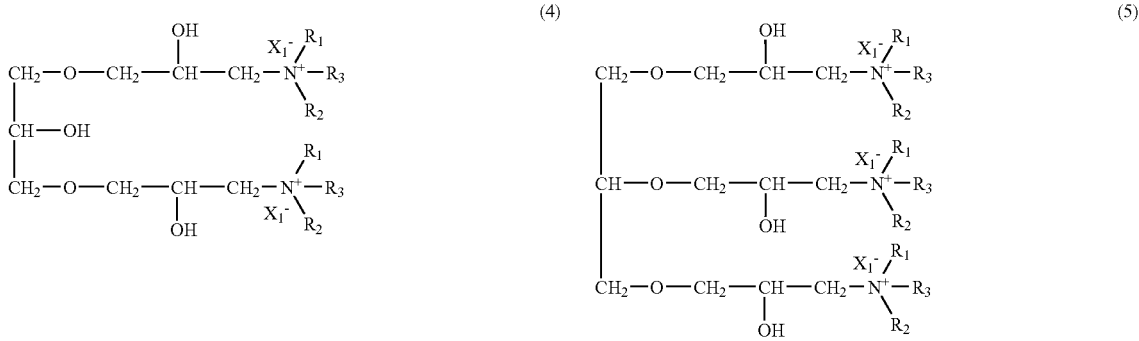
(4) (5)

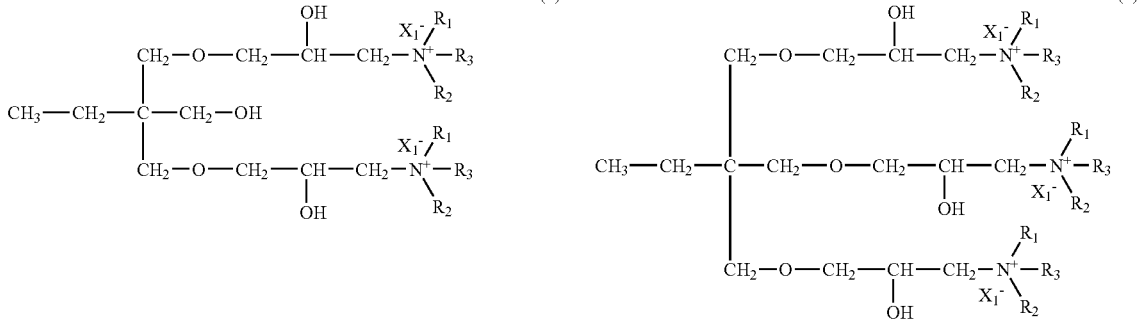
(6) (7)

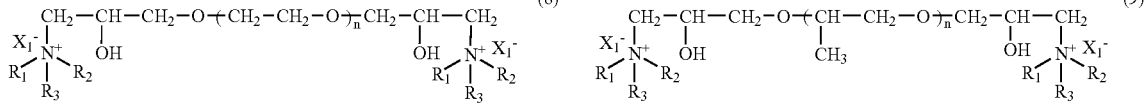
(8) (9)

(n: an integer of 1 to 22)    (n: an integer of 1 to 3)

wherein n is an integer of 1 to 3 and, wherein $R_1$ and $R_2$ each indicate a group selected from the group consisting of a hydroxyalkyl group, an ether group, an aromatic group, an aromatic-substituted alkyl group, an unsaturated hydrocarbon group and an alkyl group, $R_3$ indicates a benzyl group, an allyl group or an alkyl group with 1 to 5 carbon atoms, and $X_1^-$ indicates $Cl^-$, $Br^-$ or $CH_3SO_4^-$.

2. The copper electrolytic solution according to claim 1, characterized in that the organo-sulfur compound is a compound expressed by the following general formula (10) or (11)

$$X—R^1—(S)_{n4}—R^2—Y \quad (10)$$

$$R^4—S—R^3—SO_3Z \quad (11),$$

wherein $R^1$, $R^2$ and $R^3$ each separately is an alkylene group with 1 to 8 carbon atoms, $R^4$ is a group selected from the group consisting of hydrogen,

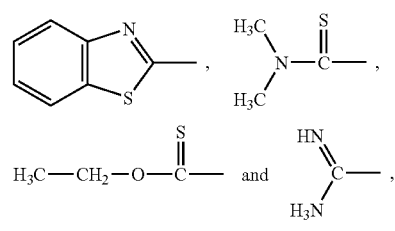

X is a group selected from the group consisting of a sulfonic acid group, a phosphonic acid group, and a sulfonic acid- or phosphonic acid-alkali metal salt group or ammonium salt group, Y is a group selected from the group consisting of a sulfonic acid group, a phosphonic acid group, and a sulfonic acid- or phosphonic acid-sodium or potassium salt group, Z is hydrogen, sodium or potassium, and $n_4$ is 2 or 3.

* * * * *

UNITED STATES PATENT AND TRADEMARK OFFICE
CERTIFICATE OF CORRECTION

| | | |
|---|---|---|
| PATENT NO. | : 7,144,491 B2 | Page 1 of 5 |
| APPLICATION NO. | : 10/480710 | |
| DATED | : December 5, 2006 | |
| INVENTOR(S) | : Masashi Kumagai et al. | |

It is certified that error appears in the above-identified patent and that said Letters Patent is hereby corrected as shown below:

Column 3 and 4; Formula (3) should read as follows:

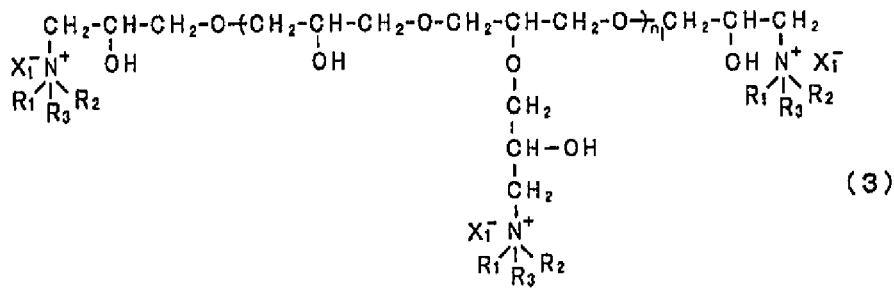

($n_1$: an integer of 1 to 5)

Column 5; Formula (8) should read as follows:

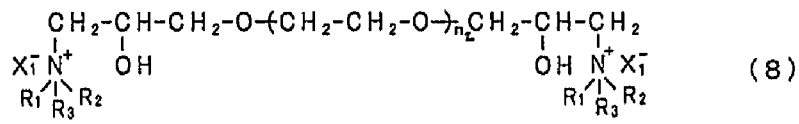

($n_2$: an integer of 1 to 22)

Column 5; Formula (10) and Formula (11) should read as follows:

$$X - R^1 - (S)_{n4} - R^2 - Y \qquad (10)$$
$$R^4 - S - R^3 - SO^3Z \qquad (11)$$

Column 6; Formula (9) should read as follows:

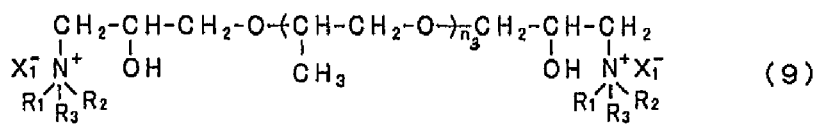

($n_3$: an integer of 1 to 3)

UNITED STATES PATENT AND TRADEMARK OFFICE
CERTIFICATE OF CORRECTION

PATENT NO. : 7,144,491 B2
APPLICATION NO. : 10/480710
DATED : December 5, 2006
INVENTOR(S) : Masashi Kumagai et al.

It is certified that error appears in the above-identified patent and that said Letters Patent is hereby corrected as shown below:

Columns 7 and 8; Formula (3) should read as follows:

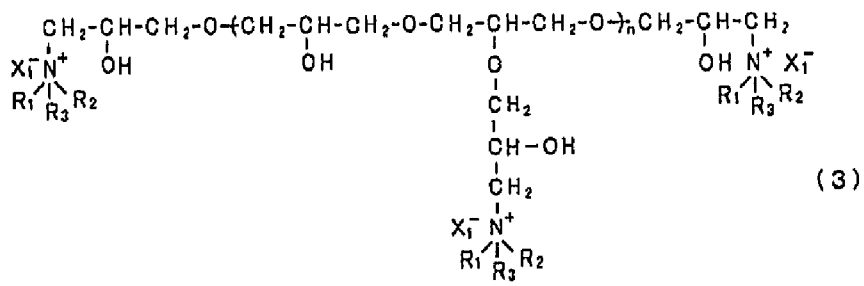

(3)

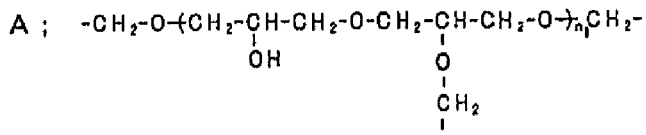

($n_1$: an integer of 1 to 5)

Column 9; Formula (8) should read as follows:

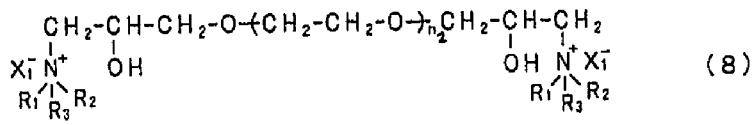

(8)

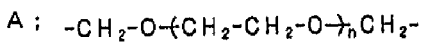

($n_2$: an integer of 1 to 22)

UNITED STATES PATENT AND TRADEMARK OFFICE
CERTIFICATE OF CORRECTION

PATENT NO.       : 7,144,491 B2
APPLICATION NO.  : 10/480710
DATED            : December 5, 2006
INVENTOR(S)      : Masashi Kumagai et al.

It is certified that error appears in the above-identified patent and that said Letters Patent is hereby corrected as shown below:

Column 10; Formula (9) should read as follows:

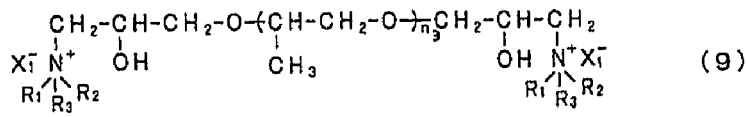

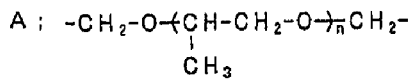

($n_3$: an integer of 1 to 3)

Columns 15-18; Claim 1 should read as follows:

1. In a copper electrolytic solution which is used in the manufacture of an electrolytic copper foil, the improvement comprising the copper electrolytic solution containing, as additives, an organo-sulfur compound and a quaternary amine compound with a specific skeleton expressed by the following general formulae (2) – (4), (6), (7) and (9), which is obtained by an addition reaction between a compound which has one or more epoxy groups per molecule and an amine compound, followed by a quaternization of the nitrogen,

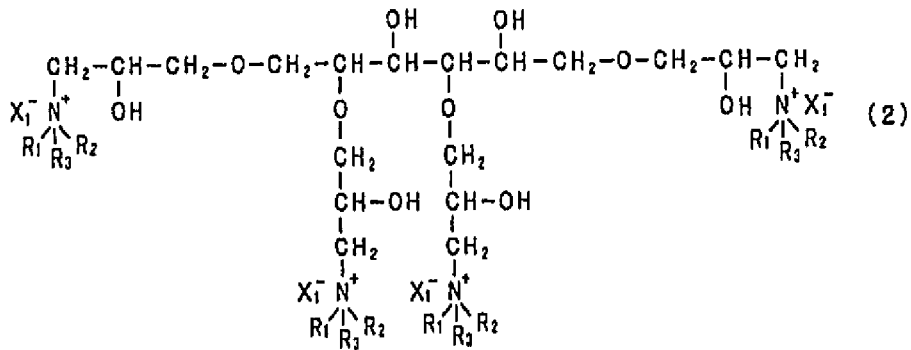

UNITED STATES PATENT AND TRADEMARK OFFICE
CERTIFICATE OF CORRECTION

PATENT NO. : 7,144,491 B2
APPLICATION NO. : 10/480710
DATED : December 5, 2006
INVENTOR(S) : Masashi Kumagai et al.

It is certified that error appears in the above-identified patent and that said Letters Patent is hereby corrected as shown below:

Columns 15-18; Claim 1 should read as follows (cont'd):

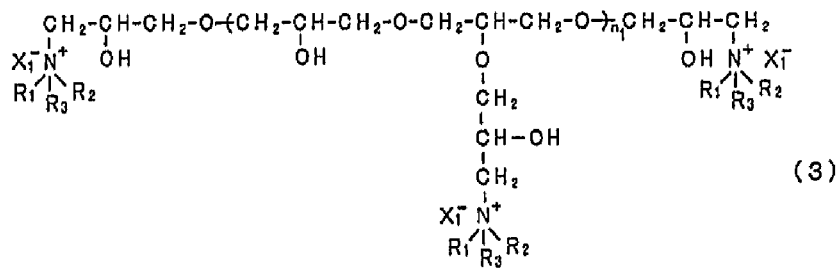

(3)

wherein $n_1$ is an integer of 1 to 5,

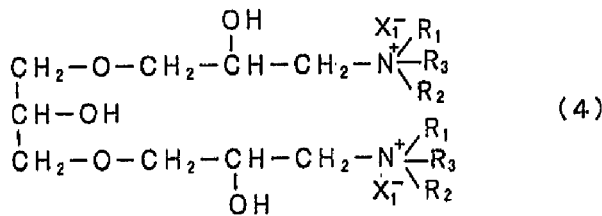

(4)

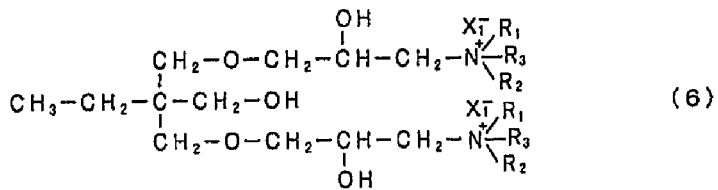

(6)

UNITED STATES PATENT AND TRADEMARK OFFICE
CERTIFICATE OF CORRECTION

PATENT NO. : 7,144,491 B2
APPLICATION NO. : 10/480710
DATED : December 5, 2006
INVENTOR(S) : Masashi Kumagai et al.

It is certified that error appears in the above-identified patent and that said Letters Patent is hereby corrected as shown below:

Columns 15-18; Claim 1 should read as follows (cont'd):

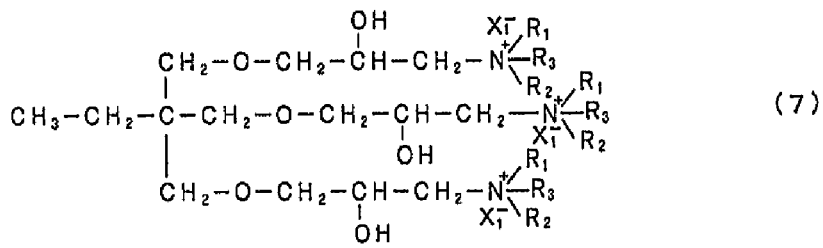

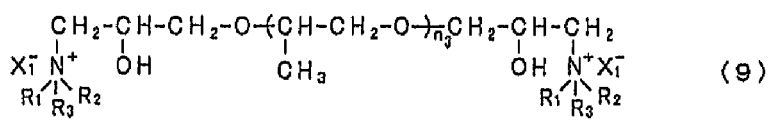

, wherein $n_3$ is an integer of 1 to 3 and, wherein $R_1$ and $R_2$ each indicate a group selected from the group consisting of a hydroxyalkyl group, an ether group, an aromatic group, an aromatic-substituted alkyl group, an unsaturated hydrocarbon group and an alkyl group, $R_3$ indicates a benzyl group, an allyl group or an alkyl group with 1 to 5 carbon atoms, and $X_1^-$ indicates $Cl^-$, $Br^-$ or $CH_3SO_4^-$.

Signed and Sealed this

Twenty-seventh Day of November, 2007

JON W. DUDAS
*Director of the United States Patent and Trademark Office*